United States Patent
Kashkoush et al.

(10) Patent No.: US 6,837,944 B2
(45) Date of Patent: Jan. 4, 2005

(54) CLEANING AND DRYING METHOD AND APPARATUS

(75) Inventors: Ismail Kashkoush, Orefield, PA (US); Gim-Syang Chen, Allentown, PA (US); Richard Ciari, Santa Clara, CA (US); Richard E. Novak, Plymouth, MN (US)

(73) Assignee: Akrion LLC, Allentown, PA (US)

( * ) Notice: Subject to any disclaimer, the term of this patent is extended or adjusted under 35 U.S.C. 154(b) by 255 days.

(21) Appl. No.: 10/091,011

(22) Filed: Mar. 4, 2002

(65) Prior Publication Data

US 2003/0019507 A1 Jan. 30, 2003

Related U.S. Application Data

(60) Provisional application No. 60/308,026, filed on Jul. 25, 2001.

(51) Int. Cl.⁷ .................................................. B08B 3/00
(52) U.S. Cl. ................................. 134/28; 134/2; 134/3; 134/26; 216/96; 510/175; 438/906
(58) Field of Search ................................ 134/26, 28, 2, 134/3, 41, 902; 216/96, 99, 108, 109; 510/175; 438/906

(56) References Cited

U.S. PATENT DOCUMENTS 5,727,578 A * 3/1998 Matthews .................... 134/61
5,911,837 A * 6/1999 Matthews ....................... 134/2
6,214,736 B1 * 4/2001 Rotondaro et al. .......... 438/705
6,495,099 B1 * 12/2002 Verhaverbeke et al. ....... 422/28
2002/0102852 A1 * 8/2002 Verhaverbeke et al. ..... 438/690

OTHER PUBLICATIONS

Patruno et al. In–situ Rinse HF–Last for Pre–Epitaxy Cleaning, UCPSS, 1994, pp. 247–250.*

* cited by examiner

*Primary Examiner*—M. Kornakov
(74) *Attorney, Agent, or Firm*—Cozen O'Connor, P.C.; Michael B. Fein, Esq.; Brian L. Belles, Esq.

(57) ABSTRACT

A method of cleaning semiconductor wafers before the epitaxial deposition comprising (A) etching silicon wafers with HF; (B) rinsing the etched wafers with ozonated ultrapure water; (C) treating the rinsed wafers with dilute SC1; (D) rinsing the treated wafers; (E) treating the wafers with dilute HF; (F) rinsing the wafers with DI water; (G) drying the wafers with nitrogen and a trace amount of IPA; wherein steps (E) through (G) are conducted in a single dryer chamber and wafers are not removed from the chamber between steps. A system comprising a single tank adapted for cleaning, etching, rinsing, and drying the wafers has means to inject HF into a DI water stream.

8 Claims, 11 Drawing Sheets

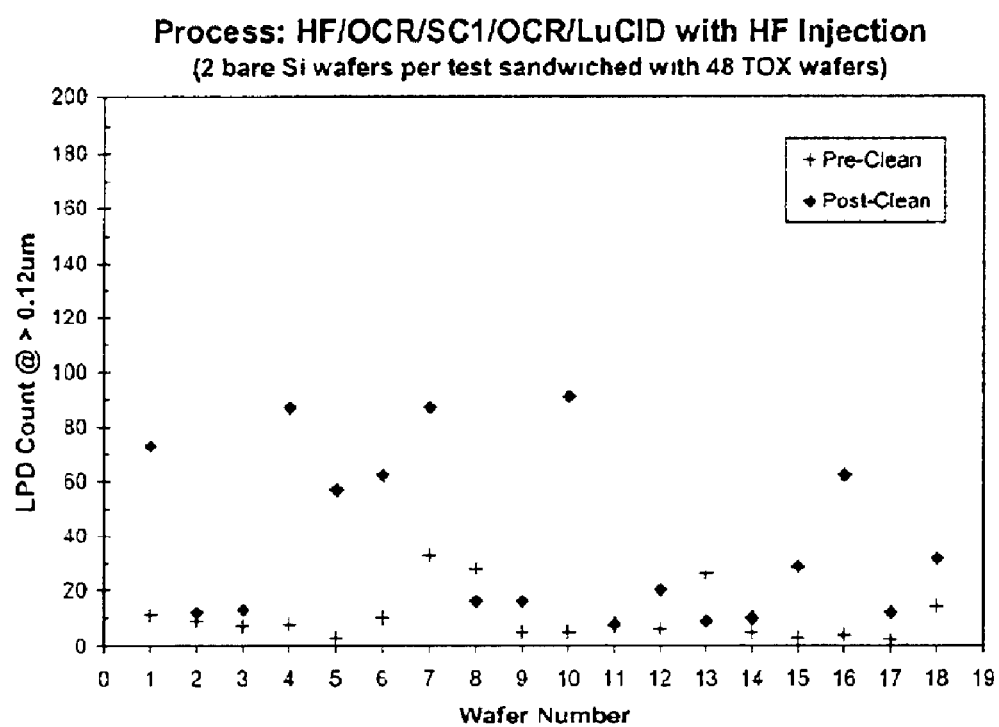
FIG. 2 (Invention)

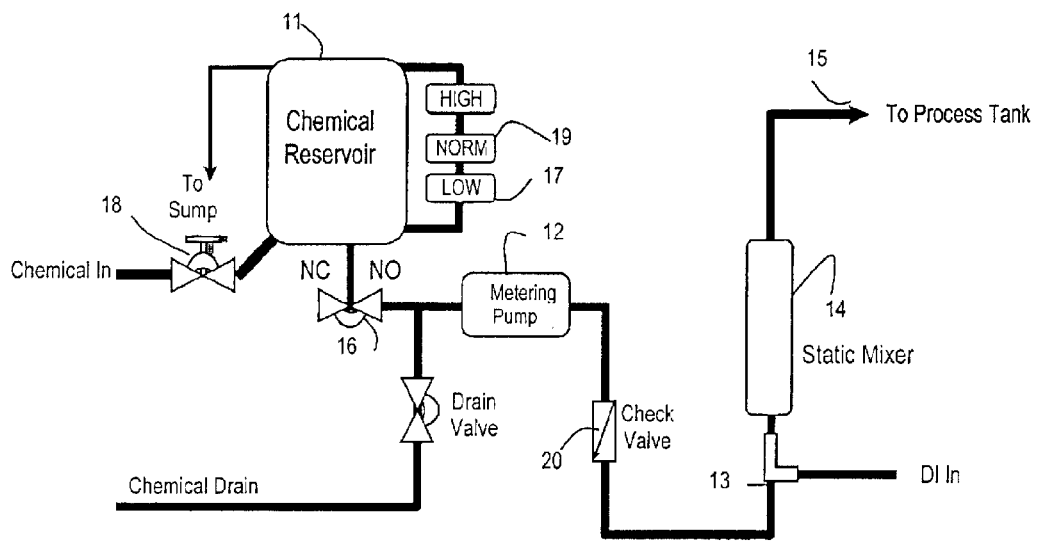
FIG. 3 (Invention)
FIG. 4 (comparative)
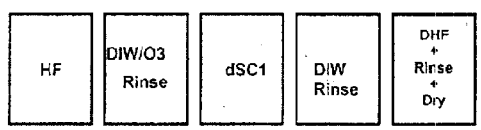
FIG. 5 (Invention)

- Fully Automated GAMA (50x200 mm)
- LuCid dryer w/ HF controlled injection
- 3 mm EE (Omega composite carrier)
- KLA-Tencor Surfscan calibrated at 0.12 μm
- Low count Si wafers were placed between oxide dummy wafers
- HF ~ 100:1 @ ambient temp.
- DHF ~ 400:1 @ ambient temp.
- dSC1 ~ 1:2:50 @ 50 C and 800 W
- DIO3 rinse ~ 5 ppm at ambient temp.
- $DO_2$ was controlled < 1 ppb
- ASML Reactor

FIG. 6 (Invention)

| Cleaning Recipe | 48 Filler Wafs | LPD Sum @ > 0.12um | | | Rudolph post-cln oxide (A) | Rudolph post-cln 1 Sigma | Post-Epi LPD >0.12um |
|---|---|---|---|---|---|---|---|
| | | Pre-Clean | Post-Clean | Delta | | | |
| SC1/OCR/HF(+surft)/OCR/LuCID(inj HF+R+Dry) | TOX | 3 | 16 | 13 | 4.390 | 0.256 | 66 |
| | TOX | 15 | 27 | 12 | 4.275 | 0.188 | 379 |
| | TOX | 8 | 45 | 37 | 4.201 | 0.234 | 211 |
| SC1/OCR/LuCID(HF+R+Dry) | TOX | 9 | 73 | 64 | 4.728 | 0.414 | 329 |
| | TOX | 10 | 12 | 2 | 4.553 | 0.294 | 267 |
| OCR/LuCID(HF+R+Dry) | TOX | 4 | 30 | 26 | 4.805 | 0.133 | 377 |
| | TOX | 8 | 40 | 32 | 4.7 | 0.117 | 250 |
| HF/OCR/SC1/OCR/LuCID(Inj HF+R+Dry) | TOX | 8 | 87 | 79 | 4.51 | 0.191 | 241 |
| | TOX | 3 | 57 | 54 | 4.459 | 0.107 | 125 |
| | TOX | 10 | 62 | 52 | 4.362 | 0.142 | 185 |
| HF/OCR/SC1/OCR/LuCID(stg HF+R+Dry) | TOX | 33 | 87 | 54 | 4.351 | 0.095 | 243 |
| | TOX | 28 | 16 | -12 | 4.37 | 0.124 | 524 |
| | poly & ntrd | 5 | 16 | 11 | 4.389 | 0.095 | 227 |
| | poly & ntrd | 5 | 91 | 86 | 4.341 | 0.129 | 430 |
| | poly & ntrd | 6 | 20 | 14 | 4.334 | 0.112 | 158 |
| | poly & ntrd | 26 | 9 | -17 | 4.288 | 0.087 | 141 |
| | poly & ntrd | 5 | 10 | 5 | 4.258 | 0.134 | 257 |
| | TOX | 3 | 29 | 26 | 4.584 | 0.18 | 242 |
| | TOX | 4 | 62 | 58 | 4.501 | 0.231 | 335 |
| | TOX | 2 | 12 | 10 | 4.252 | 0.113 | 207 |
| | TOX | 14 | 32 | 18 | 4.325 | 0.126 | 322 |

FIG. 7 (Invention)

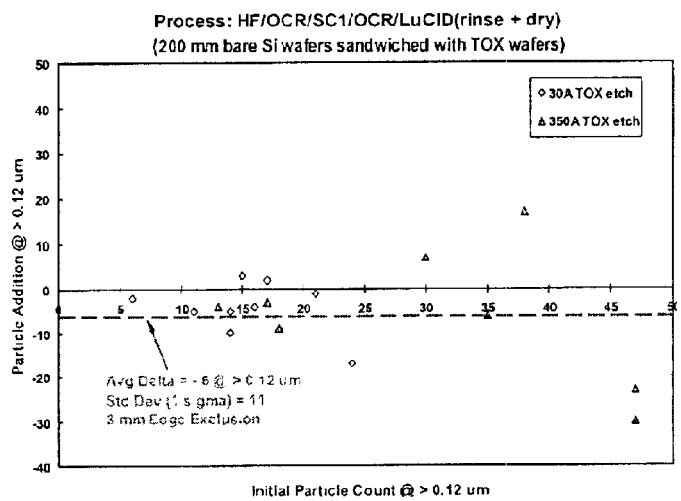
FIG. 8 (Control)
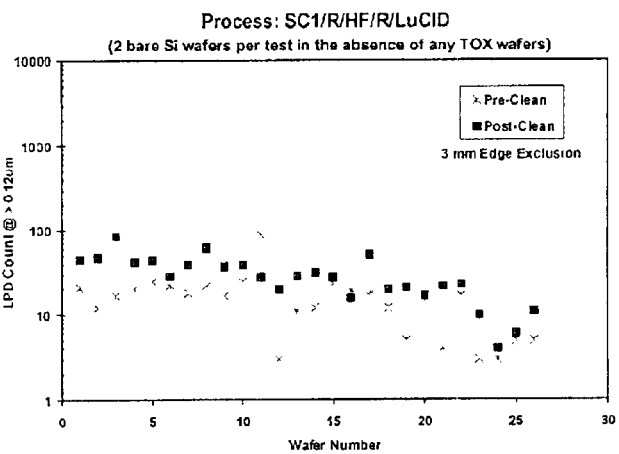
FIG. 9 (Prior art)
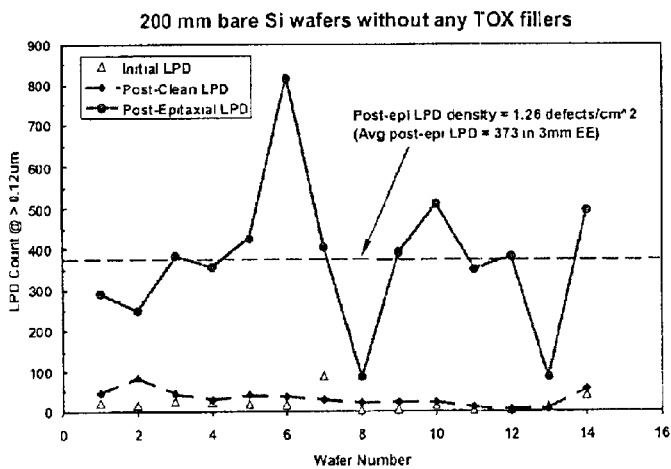
FIG. 10 (Invention)

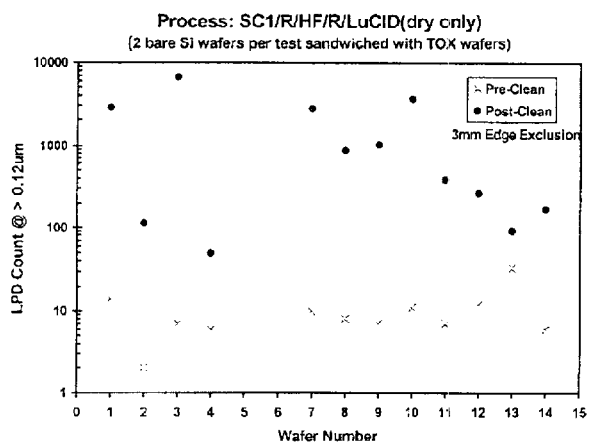
FIG. 11 (Comparative)
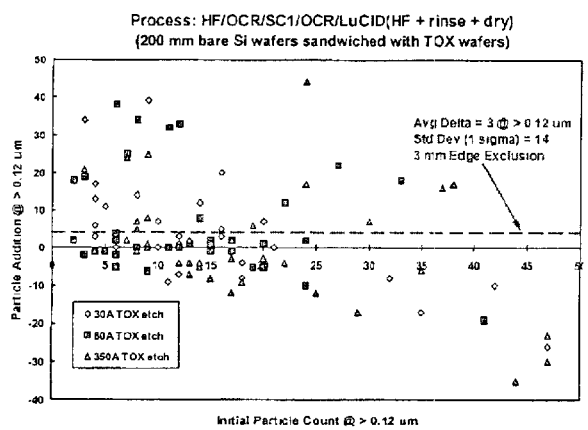
FIG. 12 (Comparative)
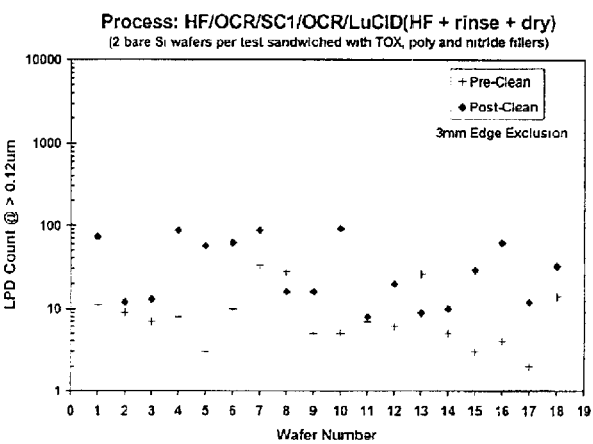
FIG. 13 (Invention)

(After Step B of Invention)

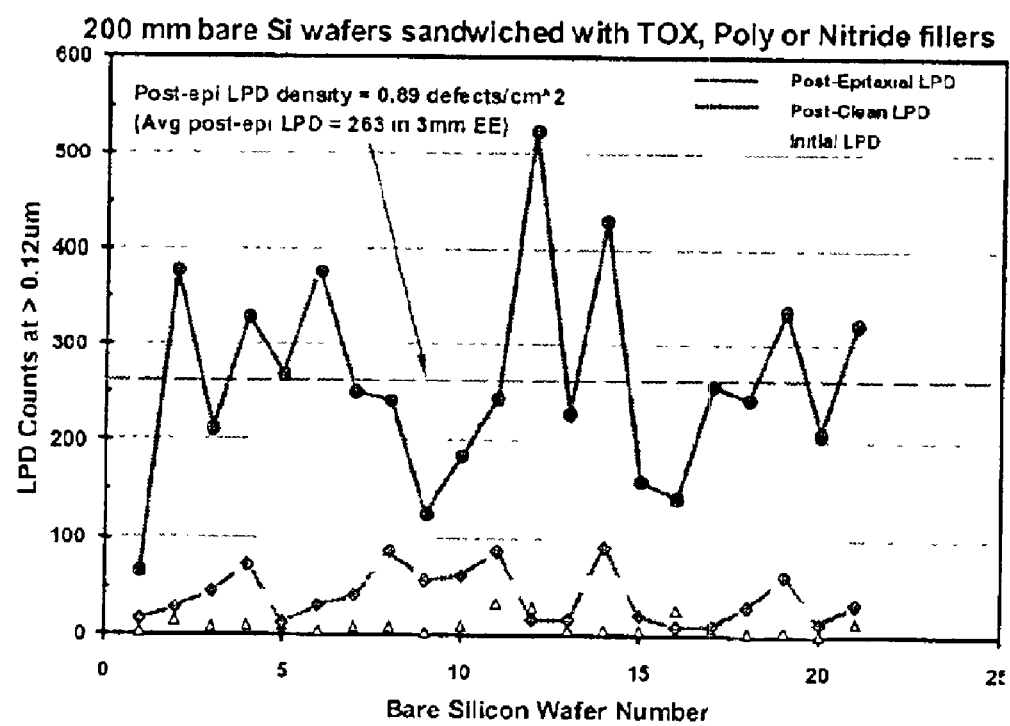
FIG. 15 (Invention)

InSitu Etch Rate and Uniformity of Thin Oxides- Sample Data 1

*Process 3:* ER and Etch Uniformity in LuCID with HF injection (5 TOX wafers / 2BareSi+43TOX)

| Thickness | 1 | 2 | 3 | 4 | 5 | 6 | 7 | 8 | 9 | Avg | 1σ (A) |
|---|---|---|---|---|---|---|---|---|---|---|---|
| before | 1011.5 | 1000.1 | 996.62 | 1014.1 | 1027.3 | 1014.7 | 1025.5 | 1040.6 | 1034.8 | | |
| after | 982.70 | 969.38 | 965.08 | 984.33 | 1000.8 | 987.71 | 1000.6 | 1016.2 | 1009.7 | | |
| (wfr B1) Δ | 28.8 | 30.72 | 31.54 | 29.77 | 26.5 | 26.99 | 24.9 | 24.4 | 25.1 | 27.64 | 2.6 |
| before | 1024.5 | 1015.4 | 1014.2 | 1020.8 | 1032.7 | 987.21 | 1028.7 | 1044.5 | 1033.6 | | |
| after | 997.28 | 987.61 | 985.70 | 991.46 | 1007.5 | 963.79 | 1004.7 | 1019.8 | 1008.4 | | |
| (wfr B13) Δ | 27.22 | 27.79 | 28.5 | 29.34 | 25.2 | 23.42 | 24.0 | 24.7 | 25.2 | 26.15 | 2.1 |
| before | 2884.5 | 2884.2 | 2858.2 | 2873.0 | 2900.3 | 2870.0 | 2859.9 | 2857.3 | 2892.7 | | |
| after | 2858.0 | 2858.1 | 2832.1 | 2847.9 | 2875.5 | 2844.2 | 2837.3 | 2833.1 | 2863.6 | | |
| (wfr B25) Δ | 26.5 | 26.1 | 26.1 | 25.1 | 24.8 | 25.8 | 22.6 | 24.2 | 29.1 | 25.59 | 1.8 |
| before | 994.56 | 996.43 | 979.71 | 1010.3 | 1021.3 | 967.93 | 998.54 | 1033.9 | 1010.3 | | |
| after | 964.18 | 970.49 | 953.16 | 982.78 | 996.10 | 943.82 | 967.09 | 1008.1 | 980.19 | | |
| (wfr F13) Δ | 30.38 | 25.94 | 26.55 | 27.52 | 25.2 | 24.11 | 31.45 | 25.8 | 30.11 | 27.45 | 2.6 |
| before | 1013.2 | 1013.2 | 1003.1 | 1028.9 | 1018.5 | 961.08 | 1017.6 | 1035.5 | 1013.3 | | |
| after | 987.39 | 988.36 | 975.99 | 1000.5 | 990.61 | 930.87 | 987.88 | 1009.1 | 984.69 | | |
| (wfr F25) Δ | 25.81 | 24.84 | 27.11 | 28.4 | 27.89 | 30.21 | 29.72 | 26.4 | 28.61 | 27.66 | 1.8 |

FIG. 16 (Invention)

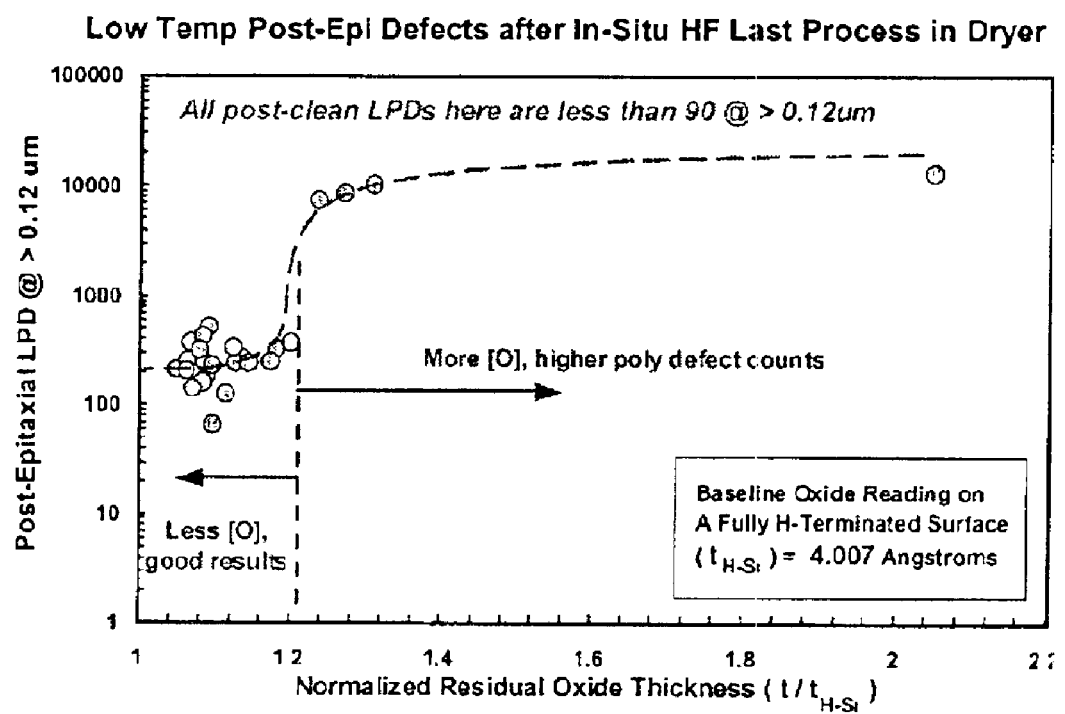
FIG. 17 (Invention)

US 6,837,944 B2

CLEANING AND DRYING METHOD AND APPARATUS

CROSS-REFERENCE TO RELATED APPLICATIONS

Benefit of Provisional Application No. 60/308,026, filed Jul. 25, 2001, is claimed.

BACKGROUND OF THE INVENTION

This invention relates to the field of manufacturing microelectronic devices, more particularly to the wafer cleaning and drying processes needed before the epitaxial deposition step.

In the manufacture of advanced ULSI integrated circuit (IC) microelectronic devices, which have dimensions in the low nanometer (nm) range, pre-epitaxial (pre-epi) cleaning procedures play critically important role. Such pre-epi processes can be either non-aqueous, or aqueous. In IC manufacturing, wafers are typically mixed with oxide wafers or the wafers are patterned. Typically, exposed silicon is adjacent to oxide or nitride areas. In HF solutions, etch byproducts will be transported from the hydrophilic surface to hydrophobic surfaces. This results in high particles counts on the exposed silicon.

Carter et al, U.S. Pat. No. 6,221,168, discloses a gas phase, non-aqueous pre-epi process for treating such microelectronic substrates which uses hydrogen fluoride (HF), isopropyl alcohol (IPA), and nitrogen (N2) at a pressure of 125 to 175 torr, and in a narrow ratio of HF, IPA, and $N_2$, with temperature controlled by infra-red or UV lamps.

Kashkoush, et al, *In-Situ Chemical Concentration Control for Wafer Wet Cleaning*, Mat. Res. Soc. Symp. Proc. Vol. 477, 311–316, disclose an "RCA" type aqueous pre-epi process which includes an SC1 (Standard Clean 1) step for removing particles and an SC2 (Standard Clean 2) step to remove metals. SCI comprises 1 part 28% $NH_4OH$, 1 part 30% $H_2O_2$, and 5 parts $H_2O$, by weight, C. for 10 minutes. SC2 is 1 part 37% HC1, 1 part 30% $H_2O_2$, and 6 parts $H_2O$), by weight. HF mix (HFM) is a dilute HF process, wherein the ratio of HF to $H_2O$) is about 200–100:1. Other mix ratios were also discussed. Chemical concentration was controlled by continually monitoring the conductivity by means of in-line sensors.

Patruno, et al, *In-Situ Rinse HF-Last for Pre-Epitaxy Cleaning*, UCPSS '94, pp. 247–250, and HF-In-Situ Tank used in HF-Last Cleaning [ECS' 94, pp. 195–205] teach dilute HF mixture being used as a final step in pre-epi cleaning, known as "HF-last," with a special, dedicated in-situ HF last rinse tank in an automated wet bench apparatus wherein a diluted HF solution is displaced by DI water. After the rinse step, the silicon wafers are transferred to a final rinse tank and then to an IPA dryer. Such multiple tank process is known in the art as SC1/Rinse/HF/Rinse/Dry.

However, prior art multi-tank HF processes result in high particle counts at 0.12 μm (>10,000). Consequently, post epitaxial defects are also high (>30 000). These light point defects (LPDs) are considered to be nucleation sites during subsequent epitaxial deposition. In the prior art, wafer transfer between tanks plays a significant role of increasing the silicate deposition into silicon wafers.

Verhaverbeke, *Isothermal Epi-Si Deposition at 800° C.*, Electrochemical Society Proceedings, Vol. 99–36, 445–451, discloses an HF-last cleaning sequence for a short $H_2$ pre-epi process wherein SOM-HF, SC1-HF, HF only, and HF/HCl are compared, and wherein HF last is taught to lower the bake/deposition temperature to substantially below 1070 C. IPA dry using the CFM Technologies, Inc., Direct Displace™ method wherein large volumes of IPA are introduced to replace the rinse water or the HF solution itself, i.e., the IPA dry step is conducted without any rinse after the HF etch step. Average particles precount >0.16 μm were 32 and average delta was 1.32+/−7, with the highest delta being 12 particles added.

It is an object of the present invention to reduce the particle counts in an aqueous HF process for cleaning integrated circuits significantly below previously reported levels and at a tighter. Another object of the present invention is provide improved silicon wafer cleaning methods and cleaning apparatus which will reduce post epitaxial defects in the manufacture of such integrated circuits.

SUMMARY OF THE INVENTION

These objects, and others which will become apparent from the following disclosure and drawings, are achieved by the present invention which comprises in one aspect a pre-epitaxial method of cleaning microelectronic devices comprising (A) etching silicon wafers with HF; (B) rinsing the etched wafers with ultra-pure ozonated water; (C) treating the rinsed wafers with dilute SC1; (D) rinsing the treated wafers with de-ionized water; (E) treating the wafers with dilute HF; (F) rinsing the wafers with de-ionized water; (G) drying the wafers with nitrogen and a trace amount of IPA; wherein steps (E) through (G) are conducted in a single dryer chamber and wafers are not removed from the chamber between steps. The method of the invention results in lower defects due to particle deposition than prior methods.

In another aspect, the invention comprises an apparatus for pre-epitaxial cleaning of silicon wafers comprising a single tank adapted for cleaning, rinsing, and drying the wafers, the apparatus comprising means to inject HF into a DI water stream. The specially designed tank is preferably constructed of fluoro-polymer material, e.g., polyvinylidene fluoride (PVDF) or PFA, which are the preferred fluoropolymers. The HF injection system preferably comprises a metering pump, a reservoir, a static mixer, and a processor to control the concentration and flow of HF into the tank. The system for directing cascading liquid into the module drain preferably comprises an outer weir. It is also preferred that the tank has a profile that provides for the optimum fluid flow field for uniform etching of dielectric films.

We have discovered that the combination of dilute chemicals and insitu DHF/Rinse/Drying are key factors to successful wafer processing for integrated circuit (IC) manufacturing.

The HF used in etching the silicon wafers is preferably in a concentration of 0.5 to 5% by weight HF in water. The dilute HF (DUF) is preferably a solution of 0.05 to 0.25% by weight HF in water. The dilute SCI is preferably a solution 1 part ammonium hydroxide (28% by weight) and 2 parts by weight hydrogen peroxide (30% by weight) in 50 to 200 parts water. The ozonated water in the rinse of step (B) preferably comprises less than about 10 parts per million (ppm) ozone in water. The dissolved oxygen (D02) is preferably controlled at less than 1 part per billion (ppb) in water, most preferably the dilute SC1 solution having ammonium hydroxide content at about 1.5% or less by weight. The total organic carbon (TOC) is preferably less than about 1 ppb in water. The total dissolved silica is preferably less than about 1 ppb in water.

BRIEF DESCRIPTION OF THE DRAWINGS

FIG. 2 is a particle signature for an in situ HF-last process at 0.12 μm according to the invention.

FIG. 3 is a chemical flow diagram of the chemical mixing and metering system of the present invention.

FIG. 4 is a flow chart of a comparative procedure.

FIG. 5 is a flow chart of a procedure according to the invention.

FIG. 6 is a list of the parameters used in a preferred embodiment according to the invention.

FIG. 7 a table which compares different cleaning methods and compares them to the invention method.

FIG. 8 is a control particle count diagram.

FIG. 9 is a particle count diagram of a comparative process.

FIG. 10 is a particle count diagram of a process according to the invention.

FIG. 11 is a particle count diagram of according to a comparative process.

FIG. 12 is a particle count diagram of a process according to the invention.

FIG. 13 is a particle count diagram of a process according to the invention.

FIG. 15 is a particle count of a method of the invention.

FIG. 16 is a table of data demonstrating etch and ER uniformity according to the invention.

FIG. 17 is a diagram showing defects according to the method of the invention.

DETAILED DESCRIPTION

Figure 1:
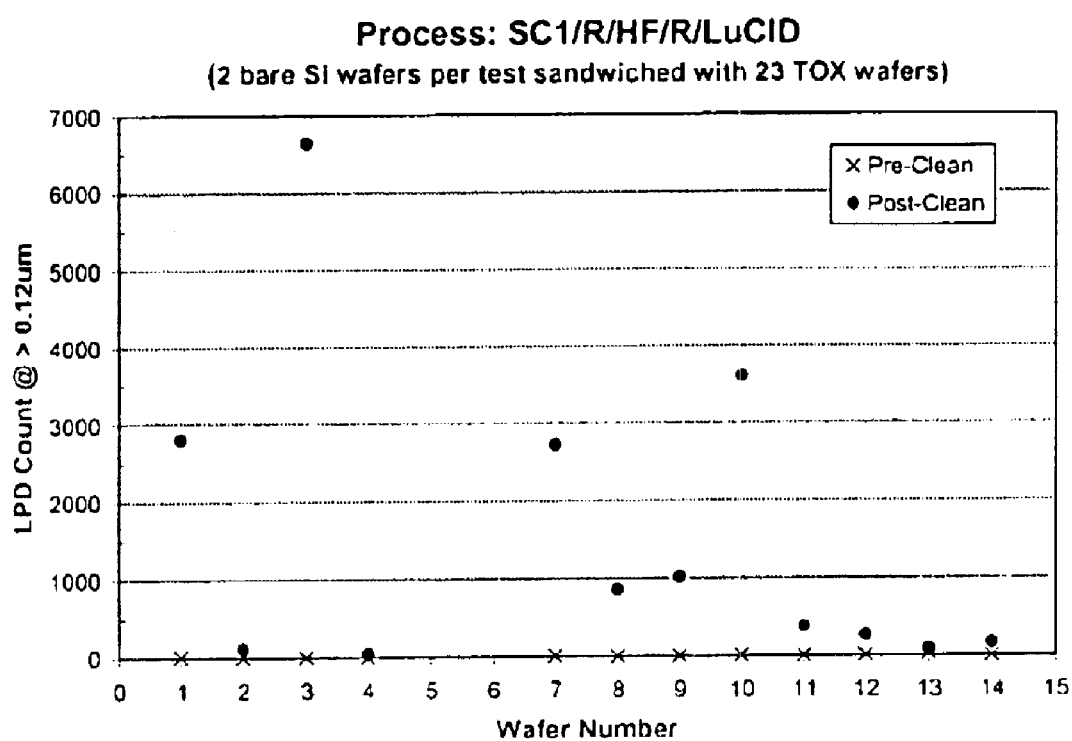
FIG. 1 is a particle signature for an in situ HF last process at 0.12 μm according to the prior art.

The preferred embodiments will be illustrated with reference to the drawings. Various other embodiments should become readily apparent from this description to those skilled in this art.

Experiments were conducted on a GAMA-1™ automated wet station, manufactured by Akrion LLC, Allentown, Pa. The GAMA-1™ automated wet station is capable of running two process sequences; multi-tank and single tank insitu process. The process flow is illustrated schematically in FIGS. 4 and 5. Test conditions are also detailed in FIG. 6. A conventional LuCid™ dryer chamber was modified to function as a combined etching, rinsing, and drying chamber, and a chemical injection system according to FIG. 3 was added. The chamber was constructed of PVDF with two walls having scalloped edges. The openings in the side-mounted fill tubes are angled upward so that during a fill cycle DI water flows between the wafers and hits the tank walls two inches below the bottom of the scalloped edge. The tank is also specially designed to allow for uniform etching of dielectric films e.g. $SiO_2$. An outer weir directs cascading liquid into the module drain. A quick-dump port was installed on the bottom of the tank.

Chemical (HF) was drawn from a reservoir 11 by an adjustable metering pump 12, injected into the DI water supply stream 13 and blended by an in-line static mixer 14. Injection 15 into the tank can occur before or after wafers are delivered to the tank. An optional soak period can be programmed after the injection cycle, followed by the standard dry cycle.

Wafers were processed in the tool prior to the epitaxial growth steps in the reactor. To simulate patterned wafers situations, silicon wafers were sandwiched between dummy oxide wafers, thereby providing the simulated contamination to the silicon wafers from the oxide wafers under the most difficult conditions. Etch byproducts were deposited from the oxide wafers onto the bare silicon wafers. The method of the invention was compared to prior cleaning techniques.

When the low level sensor 17 in the reservoir 11 detects no liquid, a signal from the computer activates the three-way pneumatic solenoid, causing the normally-closed (NC) valve 16 to open. Chemical flows through the manual valve 18 and the pneumatic solenoid into the reservoir 11 until the normal level sensor 19 is tripped. The chemical reservoir will automatically refill when the liquid level drops below the low level sensor 17 as long as no injection is occurring. If an injection is occurring, the refill is delayed until the inject time parameter has expired and the injection is finished.

To fill the tank with a DIW: Chemical solution, the computer turns on the metering pump 12. The pump 12 may be turned on during the pre-cycle stage or after product has been delivered to the tank, depending on how the inject on/off parameter is set. The pump 12 draws chemical from the reservoir 11 and sends it through the check valve 20 into the DI water stream 13. At the same time as the computer signals the pump 12 on, it also opens the DI water valve (not shown), sending DI water into the static mixer 14. Pressure from the DI water stream causes the chemical and DI water to flow into the static mixer 14 where the solution is blended before flowing into the process tank/dryer.

The pump remains on for the time set by the software parameter inject time. When inject time expires, the computer signals the pump to turn off. DI water continues to flow into the tank until the tank's liquid level sensor is tripped.

A comparative sequence of SC1/Rinse/HF/Rinse/Dry was used first to remove the contaminants resulting, as shown in FIG. 1, in particle addition in the many thousands range. A second comparative sequence wherein surfactant was added to the HF bath to improve the wettability of wafers and hence reducing the particle deposition onto the wafers resulted in improved, i.e., lower particle addition, but the presence of trace amounts of the surfactant interfered with the epitaxial growth process.

The method of the invention resulted in an average of less than 50 particles added at 0.12 μm. to the wafers for hydrophobic cleans (and worse case scenario of sandwiching oxide wafers with the test wafer) as shown in FIG. 2 while the average particle addition is −6(1σ=11) for hydrophilic cleans as shown in FIG. 8. When using only bare silicon wafers (control), the conventional HF-last process yields comparable low particle addition, as shown in FIG. 9. The average particle addition was less than 40 particles at 0.12 μm. In addition, post-epi defects were also fairly low (~1.26 defects/cm$^2$), as shown in FIG. 10.

Silicon wafers were sandwiched between oxide fillers to simulate typical wafer manufacturing. Results show that conventional HF-last process used in this situation (SC1/Rinse/HF/Rinse/Dry) produces high particle counts at 0.12 μm (>10,000) as shown in FIG. 11. Consequently, the post epitaxial defects were also high (>30 000, not shown). These LPDs (light point defects) are considered to be nucleation sites during the epitaxial deposition. Conventional wafer transfer between tanks plays a significant role in increasing silicate deposition into silicon wafers.

Figure 14:
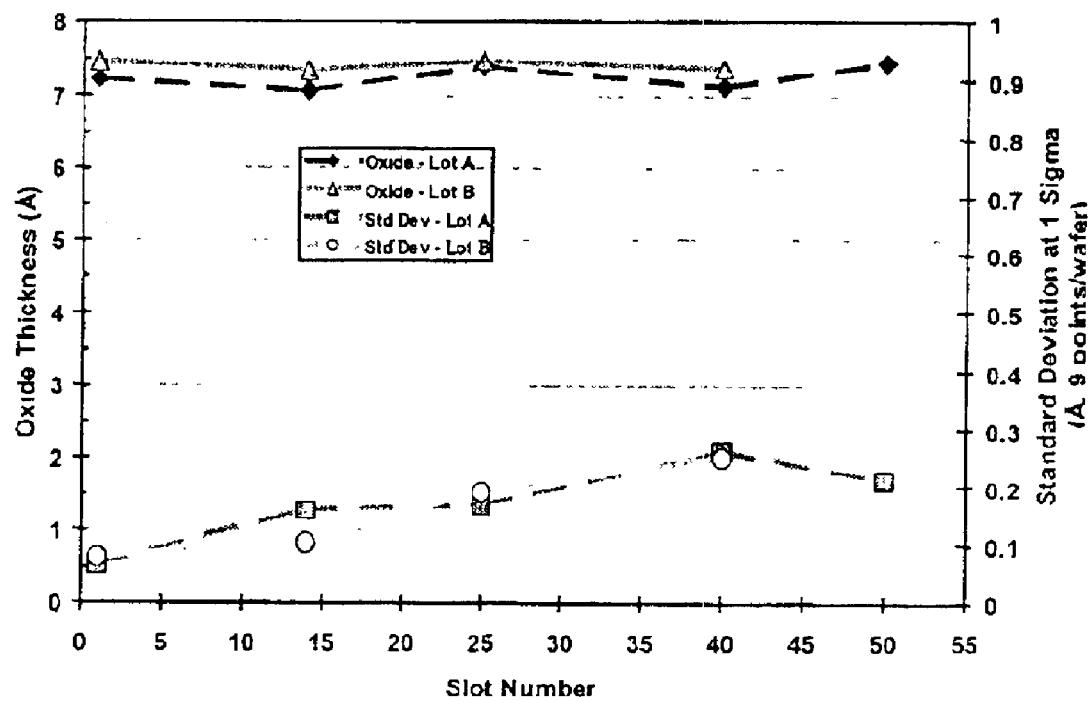
FIG. 14 is a particle count diagram after step B of the invention.

The invention process and system minimizes exposing the wafer to an air/liquid interface where contaminants may reside. Such contaminants deposit on the wafers during insertion into or pulling out of the liquid. The chemical injection system allows processing the wafers in the dryer. When wafers were processed with no transfer between cleaning steps, much lower particle deposition was obtained. As shown in FIGS. 12 and 13, an average of less than 50 particles were added to the wafers. It is important to mention here that the use of ozonated rinse after HF and before going to the SC1 step is very critical in eliminating any potential for metal-induced pitting on the hydrophobic surface. The oxide chemically grown in the ozonated rinse is stable and thick enough (7–10 Angstroms, see plots FIG. 14) to protect the silicon surface from any metal roughening effects. The post-epi cleaning results for the insitu method are shown in FIG. 10. The average LPD density per wafer is about 0.89 defects/cm$^2$. This level is significantly lower than any published data at 0.12 $\mu$m. Clearly, the lower the HF-last defects, the lower the post-epi deposition defects, as shown in FIG. 15.

The results of different cleaning recipes of the invention are summarized in FIG. 7. Different wafer types were used also as fillers to investigate if the filler wafer type has any negative impact on the results. The results showed that the most critical step to achieve extremely low post epi deposition defects is the insitu HF/Rinse/Dry with no wafer transfer between steps. Measurements were also taken to characterize the background oxide thickness as a measure of the [O] content on the wafer surface. The lower the [O] content on an H-passivated surface the lower the particle deposited as shown in FIG. 17.

Results of the experiments show significant reduction in particle deposition when compared to a conventional HF-last cleaning process. The insitu processing (one step etch/rinse/dry) has shown to be a key factor in eliminating particle deposition on exposed silicon areas on the wafer surface. Experiments showed that the use of dilute chemicals and insitu HF/Rinse/Drying yields significantly lower defects (post clean and epitaxial deposition) than those obtained during conventional multi-tank wafer processing.

Etching of thin films was conducted also in this process bath. Results show that while this process achieved the lowest particle addition to wafer under worst case scenario, uniform etching was also obtained as shown in FIG. 16. A standard deviation of 1.8–2.6 Angstroms was obtained repeatedly when etching an average film thickness of 26 Angstroms.

While the invention and preferred embodiments have been described and illustrated in sufficient detail that those skilled in this art may readily make and use the invention, various alternatives, modifications, and improvements should become readily apparent to those skilled in this art without departing from the spirit and scope of the invention.

What is claimed is:

1. A method of cleaning semiconductor wafers before the epitaxial deposition step comprising: (A) etching silicon wafers with HF solution; (B) rinsing the etched wafers with ultrapure ozonated water; (C) treating the rinsed wafers with dilute SC1 solution having ammonium hydroxide content at about 1.5% or less by weight; (D) rinsing the treated wafers; (E) treating the wafers with dilute HF solution; (F) rinsing the wafers with DI water; (G) drying the wafers with nitrogen and a trace amount of IPA; wherein steps (E) through (G) are conducted in a single dryer chamber and wafers are not removed from the chamber between steps.

2. Method of claim 1 wherein the HF solution in step (A) is a solution of 0.5 to 5% by weight HF in water.

3. Method of claim 1 wherein the dilute HF solution in step (E) is a solution of 0.05 to 0.25% by weight HF in water.

4. Method of claim 1 wherein the dilute SC1 solution is a solution of 0.1 to 0.5% by weight ammonium hydroxide and about 0.1 to 1% by weight hydrogen peroxide.

5. Method of claim 1 wherein the ozonated water in the rinse of step (B) comprises less than about 10 part per million (ppm) ozone in water.

6. Method of claim 1 wherein dissolved oxygen (DO2) is controlled at less than 1 part per billion (ppb) in water.

7. Method of claim 1 wherein total organic carbon (TOC) is less than about 1 ppb in water.

8. Method of claim 1 wherein total dissolved silica is less than about 1 ppb in water.

* * * * *